(12) United States Patent
Cideciyan (10) Patent No.: US 7,719,444 B2
(45) Date of Patent: May 18, 2010

(54) MODULATION CODING

(75) Inventor: Roy D. Cideciyan, Rueschilkon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/265,829

(22) Filed: Nov. 6, 2008

(65) Prior Publication Data

US 2009/0128378 A1    May 21, 2009

(30) Foreign Application Priority Data

Nov. 16, 2007   (EP)   ................... 07120903

(51) Int. Cl.
*H03M 7/00*     (2006.01)
(52) U.S. Cl. .......................... 341/59; 341/58
(58) Field of Classification Search .............. 341/59
See application file for complete search history.

(56) References Cited

U.S. PATENT DOCUMENTS 5,550,683 A *  8/1996  Koren ................... 360/46
6,774,825 B2 *  8/2004  Bliss et al. ............ 341/81

OTHER PUBLICATIONS

William H. Kautz; "Fibonacci Codes for Synchronization Control;" IEEE Transactions on Information Theory, vol. 11, Apr. 1965, pp. 284-292.
Thomas M. Cover; "Enumerative Source Encoding;" IEEE Transactions on Information Theory, vol. 17-19, No. 1, Jan. 1973, pp. 73-77.
Roy D. Cideciyan et al.; "A PRML System for Digital Magnetic Recording;" IEEE Journal On Selected Areas in Communications, vol. 10, No. 1, Jan. 1992, pp. 38-56.
Jan W. M. Bergmans; "4.6 Effect of Modulation Code on Adaptation;" Digital Baseband Transmission and Recording; Kluwer Academic Publishers, 1996; pp. 170-173.
Levente Patrovics et al.; "Encoding of dklr-Sequences Using One Weight Set," IEEE Transactions On Information Theory, vol. 42, No. 5, Sep. 1996; pp. 1553-1554.
Kees A. Schouhamer Immink; "A Practical Method for Approaching the Channel Capacity of Constrained Channels;" IEEE Transactions On Information Theory, vol. 43, No. 5, Sep. 1997; pp. 1389-1399.
Roy D. Cideciyan et al.; "Maximum Transition Run Codes for Generalized Partial Response Channels;" IEEE Journal On Selected Areas in Communications, vol. 19, No. 4, Apr. 2001, pp. 619-634.

(Continued)

*Primary Examiner*—Khai M Nguyen
(74) *Attorney, Agent, or Firm*—Cantor Colburn LLP (57) ABSTRACT

Methods and apparatus are provided for modulation coding of input data. In a first scheme, a modulation encoder applies a modulation code to input data to produce an (L,K)-constrained encoded bit-sequence, where K is maximum run-length of 0's, and L is the maximum run-length of 0's in each of the odd and even interleaves of the encoded bit-sequence. Then, a precoder effects $1/(1 \oplus D^4)$ preceding of the encoded bit-sequence. In a second scheme, a modulation encoder applies a modulation code to the input data to produce a K-constrained encoded bit-sequence. In this scheme, a precoder then effects $1/(1 \oplus D \oplus D^2 \oplus D^3)$ preceding of the encoded bit-sequence. In both schemes, the effect of the precoder is to produce a precoded sequence in which, in addition to other constraints, the maximum length of the variable frequency oscillator pattern is constrained to a predetermined value $C_{VFO}$.

25 Claims, 8 Drawing Sheets

OTHER PUBLICATIONS

Mario Blaum et al.; "High-Rate Modulation Codes for Reverse Concatenation;" IEEE Transactions on Magnetics, vol. 43, No. 2, Feb. 2007; pp. 740-743.

Mario Blaum et al.; "Enumerative Encoding with Non-Uniform Modulation Constraints;" IEEE International Symposium on Information Theory, ISIT 2007, Nice France, Jun. 2007, pp. 1831-1835.

* cited by examiner

| | | | | | |
|---|---|---|---|---|---|
| 00000000 | 010010010 | 00111001 | 101000011 | 01110010 | 100001011 |
| 00000001 | 011010010 | 00111010 | 100010011 | 01110011 | 101001011 |
| 00000010 | 010110010 | 00111011 | 101010011 | 01110100 | 100001101 |
| 00000011 | 011110010 | 00111100 | 100000111 | 01110101 | 101001101 |
| 00000100 | 100001100 | 00111101 | 101000111 | 01110110 | 100001111 |
| 00000101 | 101001100 | 00111110 | 100010111 | 01110111 | 101001111 |
| 00000110 | 100001110 | 00111111 | 101010111 | 01111000 | 100011001 |
| 00000111 | 101001110 | 01000000 | 011000100 | 01111001 | 101011001 |
| 00001000 | 011000001 | 01000001 | 011000101 | 01111010 | 100011011 |
| 00001001 | 011001001 | 01000010 | 011000110 | 01111011 | 101011011 |
| 00001010 | 011000011 | 01000011 | 011000111 | 01111100 | 100011101 |
| 00001011 | 011001011 | 01000100 | 011100100 | 01111101 | 101011101 |
| 00001100 | 011100001 | 01000101 | 011100101 | 01111110 | 100011111 |
| 00001101 | 011101001 | 01000110 | 011100110 | 01111111 | 101011111 |
| 00001110 | 011100011 | 01000111 | 011100111 | 10000000 | 010010001 |
| 00001111 | 011101011 | 01001000 | 011001100 | 10000001 | 011010001 |
| 00010000 | 010010100 | 01001001 | 011001101 | 10000010 | 010010011 |
| 00010001 | 011010100 | 01001010 | 011001110 | 10000011 | 011010011 |
| 00010010 | 010010110 | 01001011 | 011001111 | 10000100 | 010110001 |
| 00010011 | 011010110 | 01001100 | 011101100 | 10000101 | 011110001 |
| 00010100 | 010110100 | 01001101 | 011101101 | 10000110 | 010110011 |
| 00010101 | 011110100 | 01001110 | 011101110 | 10000111 | 011110011 |
| 00010110 | 010110110 | 01001111 | 011101111 | 10001000 | 010011001 |
| 00010111 | 011110110 | 01010000 | 100010010 | 10001001 | 011011001 |
| 00011000 | 010011010 | 01010001 | 101010010 | 10001010 | 010011011 |
| 00011001 | 011011010 | 01010010 | 110010010 | 10001011 | 011011011 |
| 00011010 | 010011100 | 01010011 | 111010010 | 10001100 | 010111001 |
| 00011011 | 011011100 | 01010100 | 100110010 | 10001101 | 011111001 |
| 00011100 | 010111010 | 01010101 | 101110010 | 10001110 | 010111011 |
| 00011101 | 011111010 | 01010110 | 110110010 | 10001111 | 011111011 |
| 00011110 | 010111100 | 01010111 | 111110010 | 10010000 | 010010101 |
| 00011111 | 011111100 | 01011000 | 100011010 | 10010001 | 011010101 |
| 00100000 | 100100100 | 01011001 | 101011010 | 10010010 | 010010111 |
| 00100001 | 101100100 | 01011010 | 110011010 | 10010011 | 011010111 |
| 00100010 | 100100110 | 01011011 | 111011010 | 10010100 | 010110101 |
| 00100011 | 101100110 | 01011100 | 100111010 | 10010101 | 011110101 |
| 00100100 | 100101100 | 01011101 | 101111010 | 10010110 | 010110111 |
| 00100101 | 101101100 | 01011110 | 110111010 | 10010111 | 011110111 |
| 00100110 | 100101110 | 01011111 | 111111010 | 10011000 | 010011101 |
| 00100111 | 101101110 | 01100000 | 110000100 | 10011001 | 011011101 |
| 00101000 | 110010100 | 01100001 | 111000100 | 10011010 | 010011111 |
| 00101001 | 111010100 | 01100010 | 110000110 | 10011011 | 011011111 |
| 00101010 | 110010110 | 01100011 | 111000110 | 10011100 | 010111101 |
| 00101011 | 111010110 | 01100100 | 110100100 | 10011101 | 011111101 |
| 00101100 | 110110100 | 01100101 | 111100100 | 10011110 | 010111111 |
| 00101101 | 111110100 | 01100110 | 110100110 | 10011111 | 011111111 |
| 00101110 | 110110110 | 01100111 | 111100110 | 10100000 | 100100001 |
| 00101111 | 111110110 | 01101000 | 110001100 | 10100001 | 101100001 |
| 00110000 | 100011100 | 01101001 | 111001100 | 10100010 | 100100011 |
| 00110001 | 101011100 | 01101010 | 110001110 | 10100011 | 101100011 |
| 00110010 | 110011100 | 01101011 | 111001110 | 10100100 | 100100101 |
| 00110011 | 111011100 | 01101100 | 110101100 | 10100101 | 101100101 |
| 00110100 | 100111100 | 01101101 | 111101100 | 10100110 | 100100111 |
| 00110101 | 101111100 | 01101110 | 110101110 | 10100111 | 101100111 |
| 00110110 | 110111100 | 01101111 | 111101110 | 10101000 | 100101001 |
| 00110111 | 111111100 | 01110000 | 100001001 | 10101001 | 101101001 |
| 00111000 | 100000011 | 01110001 | 101001001 | 10101010 | 100101011 |

Figure 7a

| | | | |
|---|---|---|---|
| 10101011 | 101101011 | 11100100 | 110110001 |
| 10101100 | 100101101 | 11100101 | 111110001 |
| 10101101 | 101101101 | 11100110 | 110110011 |
| 10101110 | 100101111 | 11100111 | 111110011 |
| 10101111 | 101101111 | 11101000 | 110011001 |
| 10110000 | 100110001 | 11101001 | 111011001 |
| 10110001 | 101110001 | 11101010 | 110011011 |
| 10110010 | 100110011 | 11101011 | 111011011 |
| 10110011 | 101110011 | 11101100 | 110111001 |
| 10110100 | 100110101 | 11101101 | 111111001 |
| 10110101 | 101110101 | 11101110 | 110111011 |
| 10110110 | 100110111 | 11101111 | 111111011 |
| 10110111 | 101110111 | 11110000 | 110010101 |
| 10111000 | 100111001 | 11110001 | 111010101 |
| 10111001 | 101111001 | 11110010 | 110010111 |
| 10111010 | 100111011 | 11110011 | 111010111 |
| 10111011 | 101111011 | 11110100 | 110110101 |
| 10111100 | 100111101 | 11110101 | 111110101 |
| 10111101 | 101111101 | 11110110 | 110110111 |
| 10111110 | 100111111 | 11110111 | 111110111 |
| 10111111 | 101111111 | 11111000 | 110011101 |
| 11000000 | 110000001 | 11111001 | 111011101 |
| 11000001 | 111000001 | 11111010 | 110011111 |
| 11000010 | 110000011 | 11111011 | 111011111 |
| 11000011 | 111000011 | 11111100 | 110111101 |
| 11000100 | 110100001 | 11111101 | 111111101 |
| 11000101 | 111100001 | 11111110 | 110111111 |
| 11000110 | 110100011 | 11111111 | 111111111 |
| 11000111 | 111100011 | | |
| 11001000 | 110001001 | | |
| 11001001 | 111001001 | | |
| 11001010 | 110001011 | | |
| 11001011 | 111001011 | | |
| 11001100 | 110101001 | | |
| 11001101 | 111101001 | | |
| 11001110 | 110101011 | | |
| 11001111 | 111101011 | | |
| 11010000 | 110000101 | | |
| 11010001 | 111000101 | | |
| 11010010 | 110000111 | | |
| 11010011 | 111000111 | | |
| 11010100 | 110100101 | | |
| 11010101 | 111100101 | | |
| 11010110 | 110100111 | | |
| 11010111 | 111100111 | | |
| 11011000 | 110001101 | | |
| 11011001 | 111001101 | | |
| 11011010 | 110001111 | | |
| 11011011 | 111001111 | | |
| 11011100 | 110101101 | | |
| 11011101 | 111101101 | | |
| 11011110 | 110101111 | | |
| 11011111 | 111101111 | | |
| 11100000 | 110010001 | | |
| 11100001 | 111010001 | | |
| 11100010 | 110010011 | | |
| 11100011 | 111010011 | | |

| n | 200 | 199 | 198 | 197 | 196 | 195 | 194 | 193 | 192 | 191 | 190 | 189 | 188 | 187 | 186 | 185 | 184 | 183 | 182 | 181 |
|---|---|---|---|---|---|---|---|---|---|---|---|---|---|---|---|---|---|---|---|---|
| $B_n 2^9$ | 194 | 195 | 196 | 197 | 198 | 199 | 200 | 201 | 202 | 203 | 204 | 205 | 206 | 207 | 208 | 209 | 210 | 211 | 212 | 213 |
| n | 180 | 179 | 178 | 177 | 176 | 175 | 174 | 173 | 172 | 171 | 170 | 169 | 168 | 167 | 166 | 165 | 164 | 163 | 162 | 161 |
| $B_n 2^9$ | 214 | 215 | 216 | 217 | 218 | 219 | 220 | 221 | 222 | 223 | 224 | 225 | 226 | 227 | 228 | 229 | 230 | 231 | 232 | 233 |
| n | 160 | 159 | 158 | 157 | 156 | 155 | 154 | 153 | 152 | 151 | 150 | 149 | 148 | 147 | 146 | 145 | 144 | 143 | 142 | 141 |
| $B_n 2^9$ | 234 | 235 | 236 | 237 | 238 | 239 | 240 | 241 | 242 | 243 | 244 | 245 | 246 | 247 | 248 | 249 | 250 | 252 | 253 | 254 |
| n | 140 | 139 | 138 | 137 | 136 | 135 | 134 | 133 | 132 | 131 | 130 | 129 | 128 | 127 | 126 | 125 | 124 | 123 | 122 | 121 |
| $B_n 2^9$ | 255 | 256 | 258 | 259 | 260 | 261 | 263 | 264 | 265 | 266 | 268 | 269 | 270 | 272 | 273 | 274 | 276 | 277 | 278 | 280 |
| n | 120 | 119 | 118 | 117 | 116 | 115 | 114 | 113 | 112 | 111 | 110 | 109 | 108 | 107 | 106 | 105 | 104 | 103 | 102 | 101 |
| $B_n 2^9$ | 281 | 282 | 284 | 285 | 286 | 288 | 289 | 291 | 292 | 294 | 295 | 297 | 298 | 300 | 301 | 303 | 304 | 306 | 307 | 309 |
| n | 100 | 99 | 98 | 97 | 96 | 95 | 94 | 93 | 92 | 91 | 90 | 89 | 88 | 87 | 86 | 85 | 84 | 83 | 82 | 81 |
| $B_n 2^9$ | 310 | 312 | 313 | 315 | 316 | 318 | 319 | 321 | 322 | 324 | 325 | 327 | 328 | 330 | 331 | 333 | 334 | 336 | 338 | 339 |
| n | 80 | 79 | 78 | 77 | 76 | 75 | 74 | 73 | 72 | 71 | 70 | 69 | 68 | 67 | 66 | 65 | 64 | 63 | 62 | 61 |
| $B_n 2^9$ | 341 | 343 | 344 | 346 | 348 | 349 | 351 | 353 | 354 | 356 | 358 | 360 | 361 | 363 | 365 | 367 | 368 | 370 | 372 | 374 |
| n | 60 | 59 | 58 | 57 | 56 | 55 | 54 | 53 | 52 | 51 | 50 | 49 | 48 | 47 | 46 | 45 | 44 | 43 | 42 | 41 |
| $B_n 2^9$ | 376 | 378 | 380 | 382 | 384 | 386 | 388 | 390 | 392 | 394 | 396 | 398 | 400 | 402 | 404 | 406 | 408 | 410 | 412 | 414 |
| n | 40 | 39 | 38 | 37 | 36 | 35 | 34 | 33 | 32 | 31 | 30 | 29 | 28 | 27 | 26 | 25 | 24 | 23 | 22 | 21 |
| $B_n 2^9$ | 416 | 418 | 420 | 422 | 424 | 426 | 428 | 430 | 432 | 434 | 436 | 438 | 440 | 442 | 444 | 446 | 448 | 450 | 452 | 454 |
| n | 20 | 19 | 18 | 17 | 16 | 15 | 14 | 13 | 12 | 11 | 10 | 9 | 8 | 7 | 6 | 5 | 4 | 3 | 2 | 1 |
| $B_n 2^9$ | 456 | 458 | 460 | 462 | 464 | 466 | 468 | 470 | 472 | 474 | 476 | 478 | 480 | 480 | 480 | 480 | 512 | 512 | 512 | 512 |

| n | 81 | 82 | 83 | 84 | 85 | 86 | 87 | 88 | 89 | 90 | 91 | 92 | 93 | 94 | 95 | 96 | 97 | 98 | 99 | 100 |
|---|---|---|---|---|---|---|---|---|---|---|---|---|---|---|---|---|---|---|---|---|
| $B_n 2^9$ | 247 | 245 | 243 | 241 | 239 | 237 | 235 | 233 | 231 | 229 | 227 | 225 | 223 | 221 | 219 | 217 | 215 | 213 | 211 | 209 |
| $j(n)$ | 5 | 5 | 5 | 5 | 5 | 5 | 5 | 5 | 5 | 5 | 5 | 5 | 5 | 5 | 5 | 5 | 5 | 5 | 5 | 2 |

| n | 61 | 62 | 63 | 64 | 65 | 66 | 67 | 68 | 69 | 70 | 71 | 72 | 73 | 74 | 75 | 76 | 77 | 78 | 79 | 80 |
|---|---|---|---|---|---|---|---|---|---|---|---|---|---|---|---|---|---|---|---|---|
| $B_n 2^9$ | 297 | 294 | 291 | 289 | 286 | 283 | 281 | 278 | 276 | 273 | 271 | 268 | 266 | 263 | 261 | 258 | 256 | 254 | 251 | 249 |
| $j(n)$ | 5 | 5 | 5 | 5 | 5 | 5 | 5 | 5 | 5 | 5 | 5 | 5 | 5 | 5 | 5 | 5 | 5 | 5 | 5 | 5 |

| n | 41 | 42 | 43 | 44 | 45 | 46 | 47 | 48 | 49 | 50 | 51 | 52 | 53 | 54 | 55 | 56 | 57 | 58 | 59 | 60 |
|---|---|---|---|---|---|---|---|---|---|---|---|---|---|---|---|---|---|---|---|---|
| $B_n 2^9$ | 356 | 353 | 350 | 347 | 344 | 341 | 338 | 335 | 332 | 329 | 326 | 323 | 320 | 317 | 314 | 311 | 308 | 305 | 302 | 299 |
| $j(n)$ | 5 | 5 | 5 | 5 | 5 | 5 | 5 | 5 | 5 | 5 | 5 | 5 | 5 | 5 | 5 | 5 | 5 | 5 | 5 | 5 |

| n | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|
| $B_n 2^9$ | 424 | 420 | 417 | 413 | 409 | 406 | 402 | 399 | 395 | 392 | 388 | 385 | 381 | 378 | 375 | 371 | 368 | 365 | 362 | 359 |
| $j(n)$ | 5 | 5 | 5 | 5 | 5 | 5 | 5 | 5 | 5 | 5 | 5 | 5 | 5 | 5 | 5 | 5 | 5 | 5 | 5 | 5 |

| n | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| $B_n 2^9$ | 512 | 512 | 512 | 512 | 480 | 480 | 480 | 476 | 472 | 468 | 464 | 460 | 456 | 452 | 448 | 444 | 440 | 436 | 432 | 428 |
| $j(n)$ | 1 | 2 | 3 | 3 | 4 | 5 | 5 | 5 | 5 | 5 | 5 | 5 | 5 | 5 | 5 | 5 | 5 | 5 | 5 | 5 |

MODULATION CODING

This application claims priority to European Patent Application No. 07120903.5, filed 16 Nov. 2007, and all the benefits accruing therefrom under 35 U.S.C. §119, the contents of which in its entirety are herein incorporated by reference.

BACKGROUND

This invention relates generally to methods and apparatus for modulation coding of data.

Modulation codes are employed in data storage systems to eliminate undesirable bit-patterns in the recording data, for example bit-sequences which give rise to errors in the reproduction process. One example of an undesirable bit-sequence is a long run of bits of the same value. Another example is a long run of bits of the same value in alternating positions in the bit sequence, i.e. in either the odd (O) or even (E) interleave of a bit stream . . . EOEOEO . . . . For instance, a long sequence of the form 0a0b0c0d0 . . . , where a, b, c, etc. can be either 0 or 1, would be generally undesirable. Modulation codes impose some form of constraint on the occurrence of undesirable bit-patterns in the encoded bit-sequence. For example, some modulation codes impose a so-called j-constraint, whereby the maximum length of a run of consecutive 1's in the encoded sequence is limited to the predetermined value j. Other modulation codes impose a constraint on the maximum run-length of consecutive 0's. This is referred to as a k- or G-constraint, whereby the maximum run-length of consecutive 0's is limited to the value k or G respectively. An example of the latter code-type is provided by the PRML (G,I) codes used in PRML (partial-response maximum likelihood) based recording systems such as tape drives and optical storage systems. In addition to the "global" or G-constraint, these codes impose an "interleave" or I-constraint. This limits the maximum run-length of 0's in each of the odd and even interleaves to the value I. An I-constrained bit-stream is of course necessarily G-constrained with G=2I.

Modulation encoders in data storage systems are generally used in conjunction with precoders. Precoders are digital filters with feedback, and apply some function of the delay operator "D" to an input where D corresponds to the channel bit period T. In communications engineering generally, precoders have been used for various different purposes to effect transmitter-side processing before a signal is transmitted over a communications channel or recorded on a storage medium. For example, precoding has been used in partial-response signaling as a channel equalization technique. In a different application, rate-1 precoders have been used to improve the properties of linear error-correcting (ECC) codes such as convolutional codes in order to improve the bit-error rate performance of partial-response systems. For instance, $1/(1 \oplus D)$ precoders (where $\oplus$ represents modulo 2 addition) have been used with convolutional encoders to improve transmission reliability over noisy partial-response channels of type (1−D) and (1+D) by Viterbi decoding on the combined code-channel trellis. The $1/(1 \oplus D)$ precoder is also known to transform NRZI (non-return to zero inverse) symbols in to NRZ (non-return to zero) symbols. Another example is discussed in "Effect of Precoding on the Convergence of Turbo Equalization for Partial Response Channels," K. R. Narayanan, IEEE Journal on Selected Areas in Commun., vol. 19, pp. 686-698, April 2001. Here, rate-1 recursive convolutional codes with transfer function $1/g(D)$, where $g(D)$ is a polynomial $1 \oplus \Sigma_j^{w-1} D^j$ with weight w, are employed for precoding in partial-response systems to improve the error-rate performance of iterative detection/decoding schemes, also known as turbo-equalization schemes. However, with modulation codes, which are generally non-linear codes, precoders are employed for an entirely different purpose to the pre-equalization of partial response systems or improvement of properties of linear ECC codes as just described. Specifically, precoders are employed in modulation coding to translate the constraints imposed by the modulation code into desired constraints at the input to the recording channel. Only two types of precoder have been used in modulation coding, namely the $1(1 \oplus D)$ precoder and the $1(1 \oplus D^2)$ precoder. Almost all practical modulation coding schemes in data storage use such precoders.

Currently most data storage systems employ forward concatenation schemes, whereby modulation coding is performed after error-correction coding (ECC) to protect the integrity of the stored data. The alternative is reverse concatenation (RC), where the modulation coding is performed before error-correction coding. Error propagation is reduced in RC modulation schemes because the ECC decoder operates before the modulation decoder on reproduction. That is, if the ECC decoder makes no errors, there is no error propagation through the modulation decoder. Hence, RC allows the use of efficient, higher rate modulation codes without suffering from performance degradation due to error propagation. Efficient high-rate modulation codes are usually generated by a technique known as enumerative encoding which allows the coding to be implemented in an algorithmic manner. Enumerative encoding is described in detail in "Enumerative Source Encoding", T. M. Cover, IEEE Trans. Inform. Theory, Vol. 19, pp. 73-77, January 1973. In simple terms, enumerative encoding is a process of mapping input words to output codewords based on lexicographic ordering of the codewords. That is, if a set of X binary codewords are ordered according to binary value, then each codeword can be assigned a number from 1 to X according to its position in the ordered set. If each of these assigned numbers 1 to X then defines the value of a binary input word, each of the X binary input words is associated with a corresponding codeword. Enumerative encoding is the process of mapping input words to output codewords in accordance with this type of scheme. While the underlying encoding principle is simple enough, the problem in practice lies in designing an efficient encoder for generating the codewords from the binary input words. If there are $2^{100}$ codewords for example, then the need for an efficient encoder design is readily apparent.

Enumerative encoders that impose either a k-constraint or a j-constraint were first proposed by W. H. Kautz in "Fibonacci Codes for Synchronization Control", IEEE Trans. Inform. Theory, Vol. 11, pp. 284-292, April 1965. The principles of these Fibonacci codes will be explained below. Enumerative encoders that satisfy a k-constraint or a j-constraint with a short sliding-window implementation of encoding and decoding have been proposed by Immink in "A Practical Method for approaching the Channel Capacity of Constrained Channels", IEEE Trans. Inform. Theory, Vol. 43, pp. 1389-1399, September 1997. These types of encoders are used together with the $1/(1 \oplus D)$-type precoders discussed above. Enumerative encoding algorithms have also been proposed for (d,k) constraints, where d represents the minimum number of consecutive 0's between two 1's, in "Encoding of dklr-sequences Using One Weight Set", Patrovics et al., IEEE Trans. Inform. Theory, Vol. 42, pp. 1553-1554, September 1996. Enumerative encoding algorithms for PRML (G,I) constraints for the special case of G=2I are described in "High-Rate Modulation Codes for Reverse Concatenation", Blaum et al., IEEE Trans. Magn., Vol. 43, No. 2, pp. 740-743, February 2007, and "Enumerative Encoding with Non-uniform Modulation Constraints", Blaum et al., IEEE Int'l. Symp. on Information Theory, ISIT 2007, Nice, France, June 2007, pp. 1831-1835. These types of encoders are used together with the $1/(1 \oplus D^2)$-type precoders discussed above.

With PRML (G,I) codes, the G-constraint at the input of the $1/(1 \oplus D^2)$ precoder translates into three constraints at the output of the $1/(1 \oplus D^2)$ precoder. Firstly, the maximum run-length of 0's is limited to $c_0 = G+2$. Secondly, the maximum run-length of 1's is limited to $c_1 = G+2$. Thirdly, the maximum number of alternating bits . . . 010101010101 . . . is limited to $c_a = G+2$. The I-constraint at the input of the $1/(1 \oplus D^2)$ precoder translates into two constraints at the output of the $1/(1 \oplus D^2)$ precoder. Firstly, the maximum run-length of 0's in each of the odd and even interleaves is limited to $i_0 = I+1$. Secondly, the maximum run-length of 1's in each of the odd and even interleaves is limited to $i_1 = I+1$.

A problem with the foregoing encoders, and enumerative encoding generally, is that very few constraints can be imposed in this way in an algorithmic fashion. In practice, however, it is desirable to impose a variety of constraints at the input to a recording channel. One important constraint is the variable frequency oscillator (VFO) constraint. This constraint limits the maximum length of patterns of the type . . . 0011001100111 . . . , known as the VFO pattern at the fundamental frequency 1/(4T) at the centre of the Nyquist band, in the recorded encoded data. This constraint cannot currently be achieved with modulation coding based on high-rate (G,I) codes as discussed above. To achieve this constraint at reasonable code-rates, more complex coding schemes have been employed. In particular, current LTO (Linear Tape Open) tape drives employ a rate 16/17 TC (twins-constrained) modulation code which is described in general terms in U.S. Pat. No. 6,985,320. This rate 16/17 code ensures that each codeword has an isolated peak (NRZI pattern 010) and imposes four constraints (j, k, t, a). Here, j and k specify the maximum run-lengths of 1's and 0's respectively. The t-constraint limits the maximum number of consecutive twins, where a twin is either 00 or 11. The a-constraint limits the maximum run-length of alternating binary symbols. The LTO modulation encoder uses a $1/(1 \oplus D)$ precoder to translate all these constraints into the desired recording channel constraints. Here, the a-constraint is translated into the VFO constraint. Specifically, the LTO rate 16/17 code limits the maximum length of the VFO pattern to $C_{VFO} = 25$. This is achieved by limiting the run-length of alternating bits to a=24 at the input of the $1/(1 \oplus D)$ precoder.

The constraints imposed by the LTO rate 16/17 code can be viewed as equivalent to the constraints G=13, I=11 and M=23, where M is the maximum run-length of 1's and is related to the VFO constraint by $C_{VFO} = M+2$ (see section V of "Maximum Transition Run Codes for Generalized Partial Response Channels, Cideciyan et al., IEEE J. Select. Areas Commun., Vol. 19, No. 4, pp. 619-634, April 2001 for an explanation of the relationship between constraints here. (G,I, M) codes are mentioned in "Digital Baseband Transmission and Recording", J. W. M. Bergmans, Kluwer Academic Publishers, 1996, page 171, referencing "A PRML System for Digital Magnetic Recording", Cideciyan et al., IEEE J. Select. Areas Commun., Vol. 10, No. 1, pp. 38-56, January 1992). Thus, the a-constraint in the LTO rate 16/17 code is equivalent to limiting the number of consecutive 1's at the input of a $1/(1 \oplus D^2)$ precoder to M=a-1=23. The first rate 8/9 PRML code implemented in IBM's disk drives satisfied the constraints G=4, I=4 and M=9 as described in the Cideciyan et al paper referenced above. The code rates 8/9 and 16/17 are low by the standards of the PRML (G,I) encoders based on enumerative coding discussed above, but the latter do not of course offer the VFO constraint.

In view of the above, it would be desirable to provide improved modulation coding systems allowing imposition of the VFO constraint.

SUMMARY

A first aspect of the present invention provides apparatus for modulation coding of input data. The apparatus comprises:

a modulation encoder for applying a modulation code to the input data to produce an encoded bit-sequence in which the maximum run-length of 0's is constrained to a predetermined value K and the maximum run-length of 0's in each of the odd and even interleaves of the encoded bit-sequence is constrained to a predetermined value L; and a precoder for effecting $1/(1 \oplus D^4)$ precoding of the encoded bit-sequence to produce a precoded sequence in which the maximum length of the variable frequency oscillator pattern is constrained to a predetermined value $C_{VFO}$.

A second aspect of the invention provides a modulation coding method corresponding to the first aspect of the invention. The second aspect of the invention provides a method for modulation coding of input data comprising:

applying a modulation code to the input data to produce an encoded bit-sequence in which the maximum run-length of 0's is constrained to a predetermined value K and the maximum run-length of 0's in each of the odd and even interleaves of the encoded bit-sequence is constrained to a predetermined value L; and effecting $1/(1 \oplus D^4)$ precoding of the encoded bit-sequence to produce a precoded sequence in which the maximum length of the variable frequency oscillator pattern is constrained to a predetermined value $C_{VFO}$.

A third aspect of the invention provides apparatus for modulation coding of input data, the apparatus comprising:

a modulation encoder for applying a modulation code to the input data to produce an encoded bit-sequence in which the maximum run-length of 0's is constrained to a predetermined value K; and a precoder for effecting $1/(1 \oplus D \oplus D^2 \oplus D^3)$ precoding of the encoded bit-sequence to produce a precoded sequence in which the maximum length of the variable frequency oscillator pattern is constrained to a predetermined value $C_{VFO}$.

A fourth aspect of the invention provides a modulation coding method corresponding to the third aspect of the invention. The fourth aspect of the invention provides a method for modulation coding of input data, the method comprising:

applying a modulation code to the input data to produce an encoded bit-sequence in which the maximum run-length of 0's is constrained to a predetermined value K; and effecting $1/(1 \oplus D \oplus D^2 \oplus D^3)$ precoding of the encoded bit-sequence to produce a precoded sequence in which the maximum length of the variable frequency oscillator pattern is constrained to a predetermined value $C_{VFO}$.

A fifth aspect of the invention provides a data storage system comprising:

modulation coding apparatus according to the first or third aspect of the invention, for modulation coding of input data comprising a succession of data words to produce a precoded sequence comprising a succession of codewords;

a recording channel comprising a storage medium and a recording/reproduction mechanism for recording the succession of codewords on the storage medium and for reading the storage medium to generate a reproduced signal;

a detector for detecting a succession of codewords in the reproduced signal; and a modulation decoder for modulation decoding the detected codewords, thereby to recover a succession of data words.

In general, where features are described herein with reference to apparatus embodying the invention, corresponding features may be provided in a method embodying the invention, and vice versa.

BRIEF DESCRIPTION OF THE DRAWINGS

Preferred embodiments of the invention will now be described, by way of example, with reference to the accompanying drawings in which.

DETAILED DESCRIPTION

Modulation coding apparatus embodying one aspect of the invention employs a modulation encoder which imposes K and L run-length constraints, followed by a precoder for effecting $1/(1 \oplus D^4)$ precoding of the modulation-encoded bit-sequence. This $1/(1 \oplus D^4)$ precoding has the effect of imposing the VFO constraint in the precoded sequence, as well as allowing translation of the K and L constraints into various additional constraints as discussed below. Any (K,L) encoder can be employed with this scheme. Since K and L relate to the same bit-sequences as G and I, the modulation encoder can take advantage of high-rate codes such as the PRML (G,I) codes based on enumerative encoding techniques exemplified earlier. An elegantly simple technique is therefore provided for imposing the VFO constraint without restriction to complex coding schemes or low code rates. Thus, simple and efficient modulation coding systems imposing the VFO constraint with high code rates can be achieved in embodiments of the invention.

In general, the precoder may operate directly or indirectly on the modulation-encoded bit-sequence, i.e. before or after some additional processing. In addition, the $1/(1 \oplus D^4)$ precoding may be performed in one or a plurality of precoder stages. In a particularly simple embodiment, the precoder comprises a single precoder stage for effecting the $1/(1 \oplus D^4)$ precoding. By way of example, however, another preferred embodiment employs a precoder comprising first and second precoder stages. The first precoder stage effects $1/(1 \oplus D \oplus D^2 \oplus D^3)$ precoding of the encoded bit-sequence to produce a partially-precoded bit sequence. The second precoder stages effects $1/(1 \oplus D)$ precoding of the partially-precoded bit sequence to produce the fully precoded sequence. In general, therefore, the precoder may comprise a plurality of precoding stages which together effect the $1/(1 \oplus D^4)$ precoding, and additional processing steps may be performed between these stages as part of the overall modulation coding scheme.

Absent any intervening processing affecting the constraints, the $1/(1 \oplus D^4)$ precoding has the effect of converting the K and L constraints at the encoder output into the following constraints on the recorded NRZ sequence in addition to the VFO constraint:

(a) the maximum run-length of 0's is constrained to a predetermined value $c_0$;

(b) the maximum run-length of 1's is constrained to a predetermined value $c_1$;

(c) the maximum number of alternating bits is constrained to a predetermined value $C_a$;

(d) the maximum run-length of 0's in each of the odd and even interleaves is constrained to a predetermined value $i_0$; and (e) the maximum run-length of 1's in each of the odd and even interleaves is constrained to a predetermined value $i_1$.

Thus, by avoiding intervening processing affecting this operation, one or more, and most preferably all, of these constraints are satisfied at the precoder output. In addition, the inherent operation of the $1/(1 \oplus D^4)$ precoder is such that the values of the various constraint parameters are as follows:

$$C_{VFO}=K+4;$$

$$c_0, c_1, \text{ and } c_a=K+4; \text{ and}$$

$$i_0 \text{ and } i_1=L+2.$$

Thus, preferred arrangements achieve these constraint values simply by avoiding any intervening processing which loosens the constraints. However, the actual constraint values may be greater if such intervening processing is performed in the modulation coding apparatus. For example, some RC embodiments may perform ECC encoding, such as partial interleaving of parity symbols, before completion of precoding. This may loosen the constraints at the precoder output, though does not necessarily do so. The final constraint values in such embodiments depend largely on the particular modulation code employed. In particularly preferred RC embodiments, the modulation code allows insertion of parity symbols at certain positions without loosening the constraints substantially, whereby tight constraints can be obtained at the input to the recording channel in a reverse concatenation system. Of course, embodiments of the invention are equally applicable to forward concatenation modulation schemes. Various examples of modulation codes used in preferred embodiments will be described in detail below.

Modulation coding apparatus embodying other aspects of the invention employs a modulation encoder which imposes a K constraint followed by a precoder for effecting $1/(1 \oplus D \oplus D^2 \oplus D^3)$ precoding of the modulation-encoded bit-sequence. Like the first aspect of the invention, the precoder here has the effect of imposing the VFO constraint in the precoded sequence as well as allowing translation of the K constraint into various additional constraints discussed below. Any K-encoder can be employed with this scheme. Again, therefore, this aspect of the invention offers simple and efficient modulation coding systems imposing the VFO constraint.

As before, the precoder may operate directly or indirectly on the modulation-encoded bit-sequence, i.e. before or after some additional processing. Also, the precoder may comprise a plurality of precoding stages which together effect the $1/(1 \oplus D \oplus D^2 \oplus D^3)$ precoding, and additional processing steps may be performed between these stages as part of the overall modulation coding scheme. However, absent any intervening processing affecting the constraints, the $1/(1 \oplus D \oplus D^2 \oplus D^3)$ precoding has the effect of converting the K constraint at the encoder output into the following constraints in addition to the VFO constraint:

(a) the maximum run-length of 0's is constrained to a predetermined value $c_0$;

(b) the maximum run-length of 1's is constrained to a predetermined value $c_1$; and (c) the maximum number of alternating bits is constrained to a predetermined value $c_a$.

Hence one or more, and most preferably all, of these constraints can be satisfied at the precoder output. Also, the inherent operation of the $1/(1 \oplus D \oplus D^2 \oplus D^3)$ precoder gives $C_{VFO}=K+3$, as well as $c_0=c_1=c_a=K+3$. Thus, preferred arrangements achieve these constraint values simply by avoiding any intervening processing which loosens the constraints.

In some embodiments of the invention the encoder additionally imposes an L constraint, i.e. the maximum run-length of 0's in each of the odd and even interleaves of the encoded bit-sequence is constrained to L. With this additional encoding constraint, the precoder operation provides an additional constraint, known as the data sequence separator (DSS) constraint, in the precoded sequence. This will be described further below.

Figure 1:
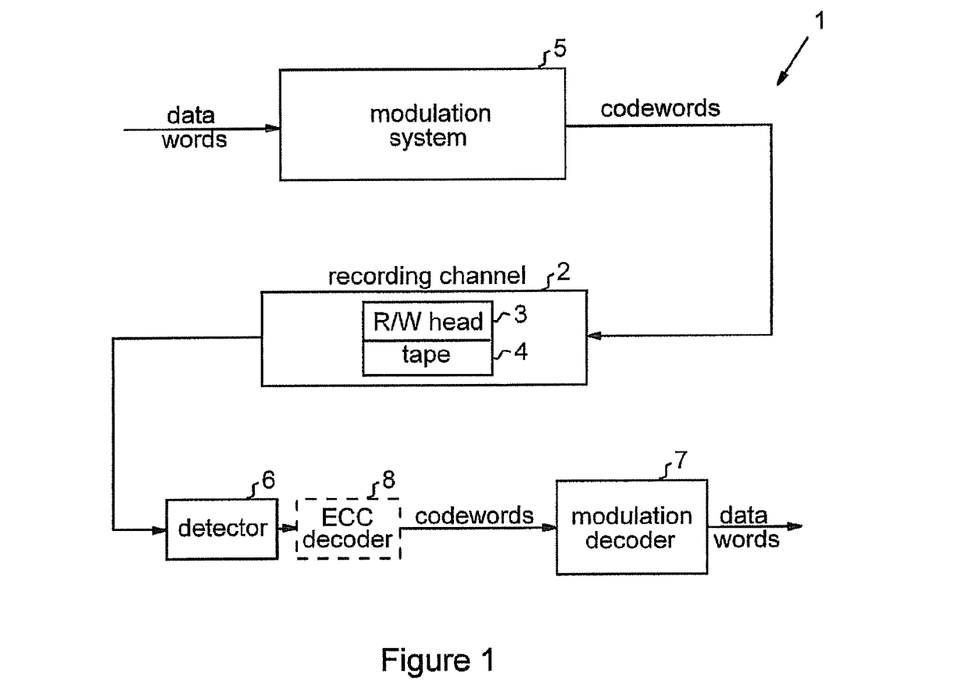
FIG. 1 is a schematic block diagram of a data storage system embodying the invention.

The block diagram of FIG. 1 is a schematic representation of a data storage system embodying the invention showing the main components involved in the recording/reproduction process. In this embodiment, the data storage system is a tape drive, indicated generally at 1, and thus has a recording channel 2 having a read/write head 3 for reading and writing to magnetic tape 4. On the recording side, the tape drive 1 includes modulation coding apparatus, represented here as modulation system 5, which is described in more detail below. On the reproduction side the drive 1 includes a detector 6 and a modulation decoder 7. If the modulation system 5 is a reverse concatenation (RC) system, an ECC decoder 8 is included before modulation decoder 7 as indicated by the broken lines in the figure.

In operation, data to be recorded is supplied to modulation system 5 in the form of a bit-sequence comprising a succession of data words. Modulation system 5 performs modulation coding (and, in RC embodiments, ECC coding) of the input data as detailed below to produce an encoded output sequence comprising a succession of codewords. The resulting codewords are then recorded on tape 4 after the usual write-equalization in channel 2. On reproduction, the reproduced signal obtained by reading tape 4 is supplied to detector 6 after the usual signal processing in channel 2 (typically preamplification, automatic gain control, low-pass filtering, sampling and partial response equalization). The detector 6 is typically a Viterbi detector, and detects the succession of codewords in the reproduced signal in known manner. Where provided at this point, ECC decoder 8 then operates to correct errors in the detected codewords. In examples to be described, this ECC-decoding involves parity checking and error correction processing in accordance with the ECC coding performed in RC embodiments of modulation system 5 described below. The resulting succession of codewords is then supplied to decoder 7 which performs modulation decoding of the succession of codewords to recover a succession of data words corresponding to the original input data.

Figure 2:
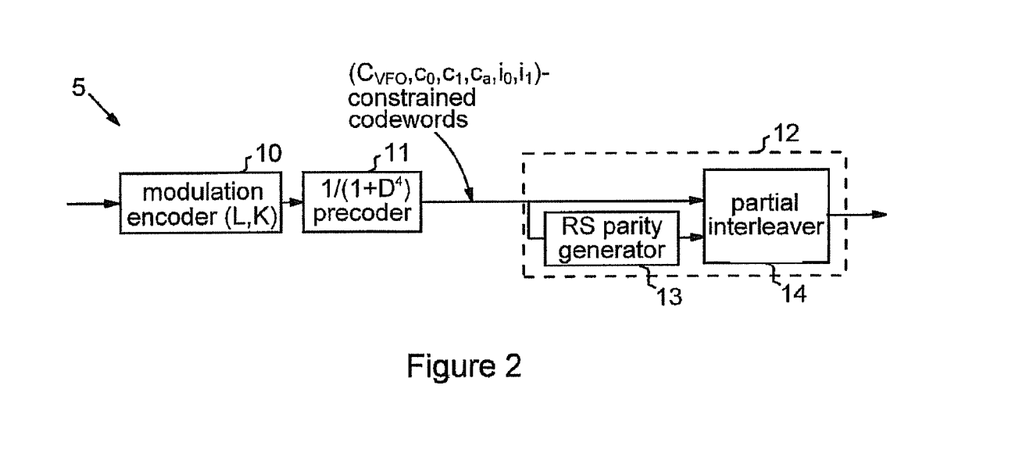
FIG. 2 is a more detailed block diagram of modulation coding apparatus in the FIG. 1 system.
Figure 3:
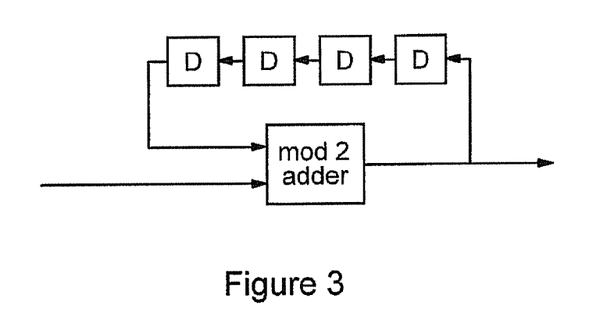
FIG. 3 illustrates a precoder of the FIG. 2 apparatus.

A first embodiment of modulation system 5 is illustrated in FIG. 2. This system comprises a modulation encoder 10 and a $1/(1 \oplus D^4)$ precoder 11. Where reverse concatenation is employed, system 5 may also include an ECC encoder 12 as indicated by the broken lines in the figure. In operation, modulation encoder 10 applies a modulation code to the input data to produce an encoded bit-sequence in which the maximum run-length of 0's is constrained to a value K and the maximum run-length of 0's in each of the odd and even interleaves of the encoded bit-sequence is constrained to a value L. Various examples of preferred implementations for the modulation encoder 10 will be described below. The resulting modulation-encoded bit-sequence is supplied to precoder 11. This effects $1/(1 \oplus D^4)$ precoding of the encoded bit-sequence in a single precoding stage. FIG. 3 illustrates the construction of precoder 11 here. It can be seen that the precoder is an infinite impulse response (IIR) filter with four delay elements D each corresponding to the channel bit period T of the input encoded bit-sequence. The feedback signal output by these delay elements is modulo-2 added to the input bit-sequence as indicated by the mod-2 adder block (logical XOR gate). The effect of precoder 11 is to translate the K and L constraints in the input bit-sequence into a set of six constraints at the precoder output. Specifically, in the precoded bit-sequence output by precoder 11 the following constraints are satisfied:

the maximum length of the VFO pattern . . . 001100110011 . . . is constrained to $C_{VFO}=K+4$;

the maximum run-length of 0's is constrained to $c_0=K+4$;

the maximum run-length of 1's is constrained to $c_1=K+4$;

the maximum number of alternating bits is constrained to $c_a=K+4$;

the maximum run-length of 0's in each of the odd and even interleaves is constrained to $i_0=L+2$; and the maximum run-length of 1's in each of the odd and even interleaves is constrained to $i_1=L+2$.

It will be seen that the combined effect of modulation encoder 10 and $1/(1 \oplus D^4)$ precoder 11 is to impose the VFO constraint $C_{VFO}$ in the precoded sequence in addition to constraints corresponding to those currently obtained with a PRML(G,I,) code followed by a $1/(1 \oplus D^2)$ precoder. Equivalent constraints to a PRML(G,I,M) code discussed above are thus obtained in an elegantly simple manner which is also highly flexible since any (L,K) code can be employed in modulation encoder 10. The resulting NRZ-format codewords at the precoder output may be supplied directly to channel 2 in forward concatenation systems. In RC embodiments, however, ECC coder 12 can be incorporated after precoder 11. In this example, ECC coding involves partial interleaving of parity symbols in the codeword stream from precoder 11. In particular, the ECC coder 12 consists of a RS (Reed-Solomon) parity symbol generator 13 and a partial symbol interleaver 14. Unconstrained RS parity symbols are generated in known manner from the input codewords by parity generator 13. These symbols are then inserted at desired points in the precoded bit-stream by partial interleaver 14. The particular locations at which the parity symbols are inserted depends on the modulation code applied by modulation encoder 10. In particular, exemplary modulation codes described below allow insertion of unconstrained parity symbols at defined locations without destroying the constraints. In any case, the resulting ECC-encoded codewords in NRZ format are then supplied to channel 2 for recording.

On reproduction, after detection and, in RC systems, ECC-decoding as already described, modulation decoder 7 first performs the inverse precoding operation, here $(1 \oplus D^4)$ inverse precoding. The modulation decoder then applies the inverse of the modulation code applied by encoder 10 to effect modulation decoding of the detected codewords, thereby to recover the original input data.

Figure 4:
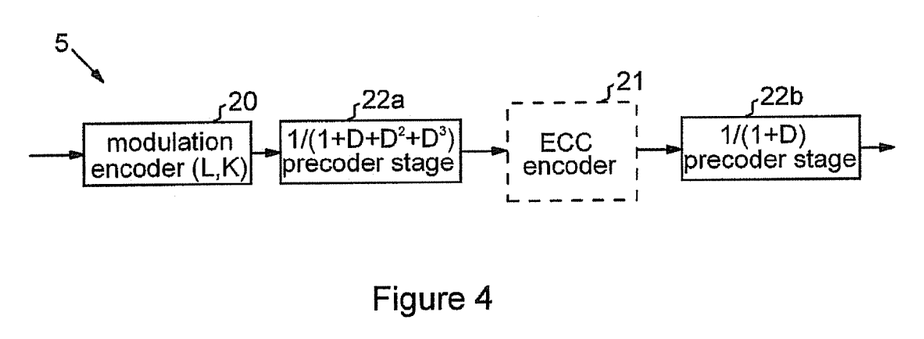
FIG. 4 shows another embodiment of modulation coding apparatus for the FIG. 1 system.
Figure 5:
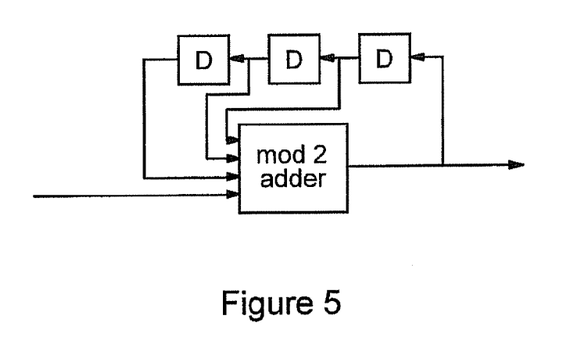
FIG. 5 illustrates a first precoder stage of the FIG. 4 apparatus.

FIG. 4 shows another embodiment of modulation system 5 for use in tape drive 1. This system again comprises a modulation encoder 20, optionally an ECC encoder 21 for RC implementations, and a precoder for effecting $1/(1 \oplus D^4)$ precoding. Here, however, the precoder is implemented as first and second precoder stages 22a and 22b which together effect the $1/(1 \oplus D^4)$ precoding. The first precoder stage 22a is a $1/(1 \oplus D \oplus D^2 \oplus D^3)$ precoder structure as illustrated in FIG. 5. The second precoder stage 22b is a $1/(1 \oplus D)$ precoder structure which corresponds to the structure of FIG. 3 with the four delay elements replaced by a single delay element. Modulation encoder 20, and ECC encoder 21 where provided, are identical to the corresponding elements 12 and 10 of FIG. 2. Thus, modulation encoder 20 generates an encoded bit-sequence comprising a succession of (L,K)-constrained codewords. The first precoder stage 22a performs $1/(1 \oplus D \oplus D^2 \oplus D^3)$ precoding of the (L,K)-constrained encoder output to produce a partially-precoded bit sequence. Where ECC encoder 21 is provided, the partially-precoded bit-sequence is then subject to partial symbol interleaving as already described. The encoded bit sequence, in NRZI format, is then input to the second precoder stage 22b. This effects $1/(1 \oplus D)$ precoding, resulting in NRZI to NRZ format conversion as mentioned earlier, and also completes the $1/(1 \oplus D^4)$ precoding.

The precoded sequence output by precoder stage 22b in FIG. 4 comprises a succession of codewords with $C_{VFO}$, $c_0$, $c_1$, $c_a$, $i_0$ and $i_1$ constraints as described above for the system of FIG. 2. However, the splitting of the $1/(1 \oplus D^4)$ precoding in the FIG. 4 system has the advantage of preserving the $1/(1 \oplus D)$ precoding which is implemented within the write equalizer at the channel input in certain existing tape drives, in particular LTO 2-4 tape drives. Thus, no changes in the circuitry performing write equalization are required. However, the $1/(1 \oplus D^4)$ precoding structure could be split in other ways if desired as will be apparent to those skilled in the art. The key point with both the modulation systems described above is that use of a $1/(1 \oplus D^4)$ precoder structure allows the VFO constraint and the other constraints described above to be obtained with any modulation encoder 10, 20 which imposes the constraints on K and L. The modulation encoder 10, 20 can be implemented in various ways, and can take advantage of efficient, high rate coding schemes such as those based on enumerative encoding. By way of example, various non-linear modulation codes which can be employed in preferred embodiments of modulation encoder 10, 20 will now be described.

Figure 6:
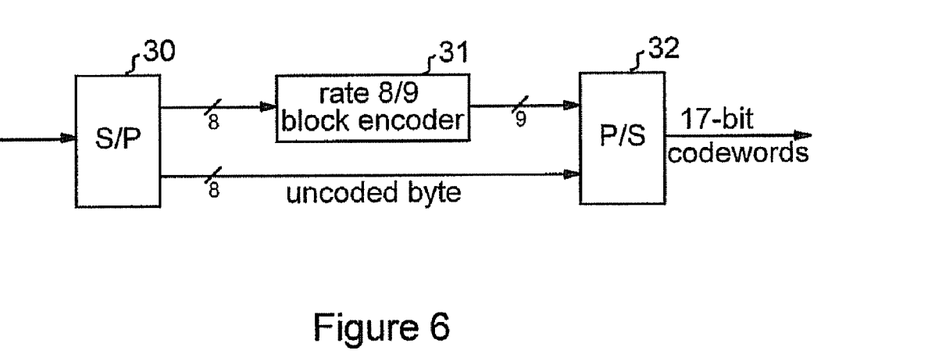
FIG. 6 shows an exemplary modulation encoder for use in modulation coding apparatus embodying the invention.
Figure 7A:
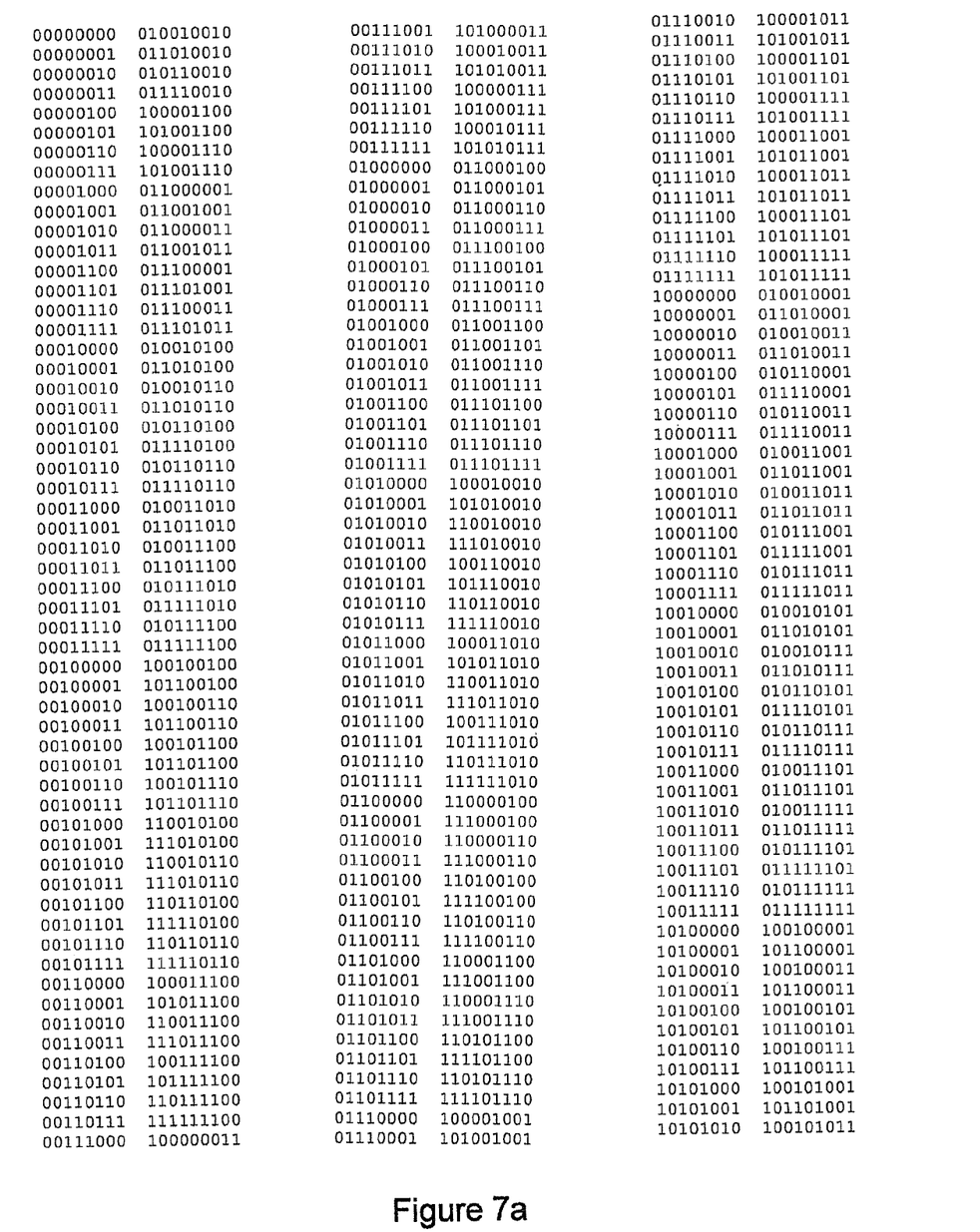
FIGS. 7a and 7b tabulate a block code used in the FIG. 6 encoder.
Figure 7B:
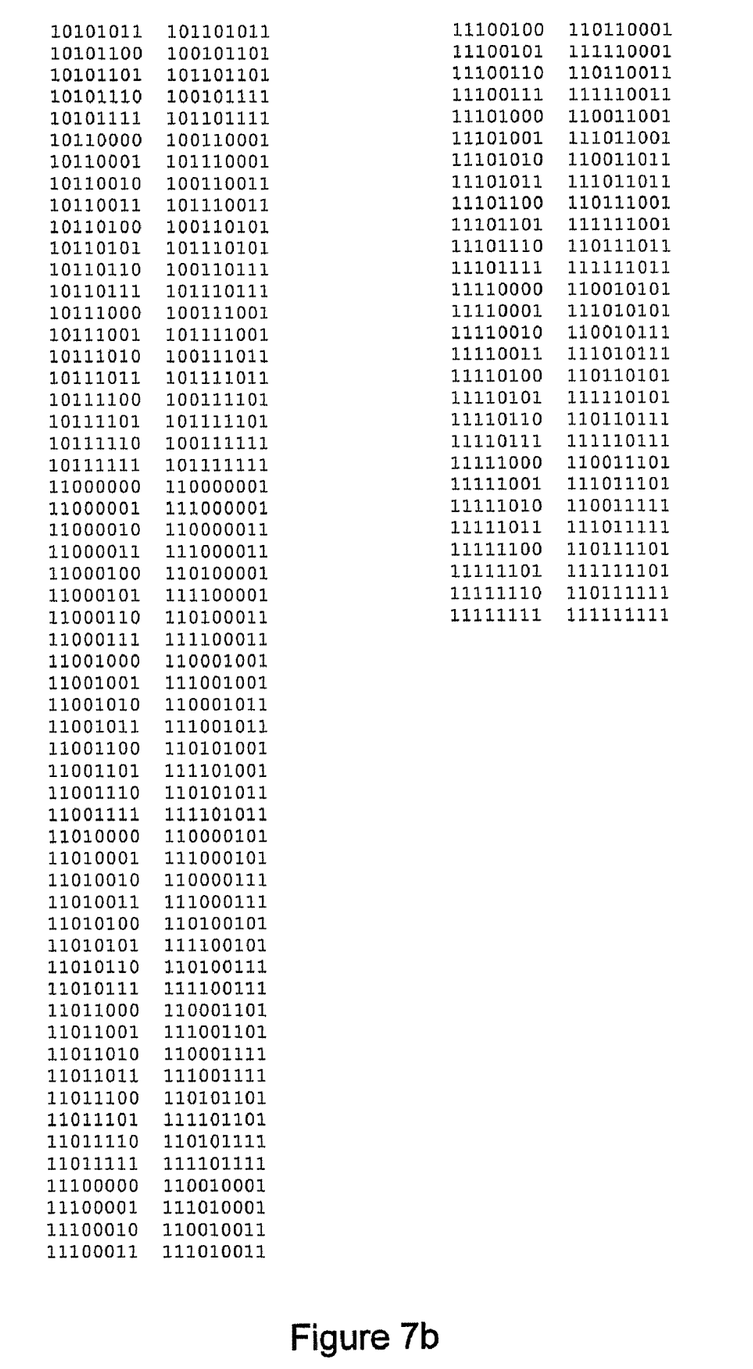

The first coding scheme applies a rate 16/17 modulation code. This is similar to the LTO modulation code referenced earlier in that it is a rate 16/17 partitioned block code based on a finite state coding scheme. Specifically, the modulation encoder applies the rate 16/17 partitioned block code by partitioning each 16-bit data word into two bytes and encoding one of the bytes in accordance with a rate 8/9 block code. The structure of this modulation encoder is illustrated in FIG. 6. A serial-to-parallel (S/P) converter 30 converts the input bit-stream into 16-bit words which are then partitioned into two bytes. One of these bytes is then input to a block encoder 31 which implements a rate 8/9 block code based on a one-to-one mapping that assigns a 9-bit codeword to each 8-bit data word. The rate 8/9 mapping performed by block encoder 31 is set out in the tables of FIGS. 7a and 7b. This mapping is designed such that the complexity of the Boolean logic needed to implement the encoder 31 and its corresponding decoder is low. A 17-bit codeword is then produced by appending an uncoded byte to a 9-bit codeword in P/S converter 32 which thus outputs the 17-bit codeword in serial form. The rate 8/9 code is constructed such that the 17-bit codewords satisfy the constraints K=11 and L=9. Hence, when this modulation encoder is used in forward concatenation schemes based on FIG. 2 or 4, the constraints at the channel input will be $C_{VFO}=c_0=c_1=c_a=15$, and $i_0=i_1=11$.

While a particular example has been described, other partitioned block coding schemes could be employed in modulation encoder 10, 20. In general, therefore, the modulation encoder could apply a rate X/Y partitioned block code by partitioning each of a succession of X-bit input data words into a plurality of blocks of bits and then, for each X-bit data word, encoding at least one of the blocks in accordance with a finite state coding scheme so as to produce a Y-bit codeword. However, particularly preferred coding schemes are based on enumerative encoding as illustrated by the following examples.

The second coding scheme utilizes a two-way interleaved Fibonacci code, that is a Fibonacci code which is applied to each of the odd and even interleaves of the input data stream. Fibonacci codes as referenced earlier are characterized by a set of weights, also called bases, which define the value of a binary 1 at respective positions in a binary codeword representation. That is, a 1 at a given position in a binary codeword represents the value of the Fibonacci weight for that position rather than the usual power of two. Briefly, a generalized Fibonacci code of (codeword-) length N is characterized by weights, which are positive integers, of the following form:

$$w_n = B_n 2^n \quad n=0, 1, \ldots, N-1$$

where $B_n \leq 1$. Given a predetermined parameter j, the W. H. Kautz paper referenced earlier defines the first j+1 weights by $w_n = 2^n$, $n=0, 1, \ldots, j$, and requires that the linear recursion $$w_{n+1} = w_n + w_{n-1} + \ldots + w_{n-j}$$

holds for $n=j, \ldots, N-2$. The linear recursion can be weakened by replacing the equality by an inequality in the linear recursion. This results in a set of linear inequalities for the bases $B_n$, namely $$B_{n+1} 2^{j+1} \leq B_n 2^j + B_{n-1} 2^{j-1} + \ldots + B_{n-j} \text{ for } n=j, \ldots, N-2.$$

The parameter j determines the j-constraint of the resulting generalized Fibonacci code. In order to achieve efficient coding and decoding one chooses the $B_n$ to be fractional binary numbers in the range $2^{-S} \leq B_n \leq 1$ which have an S-bit representation. The bases are then said to have a limited span of S. Given a binary input word $u_1, u_2, \ldots, u_N$ the block encoder for the generalized Fibonacci code computes the binary output word $v_1, v_2, \ldots, v_N$ by performing a "generalized base change":

$$\sum_{i=1}^{N} u_i 2^{N-i} = \sum_{n=1}^{N} v_n w_{N-n}$$

The generalized base change can be computed in a sliding window fashion with a window width equal to the span S.

Figure 8:
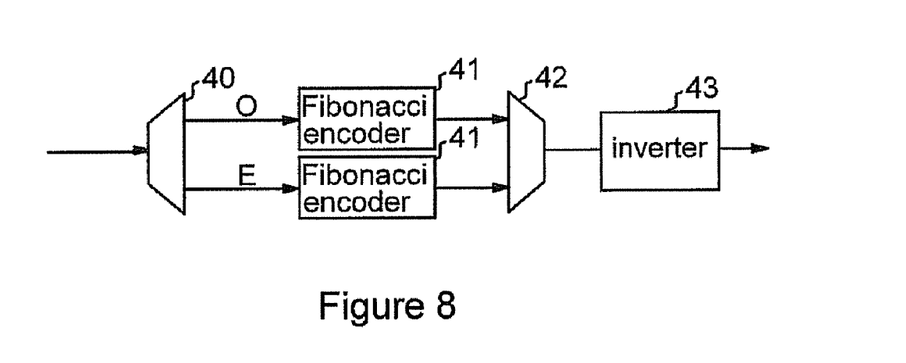
FIG. 8 shows another modulation encoder for use in modulation coding apparatus embodying the invention.

FIG. 8 shows the structure of the modulation encoder for the second coding scheme. This has a demultiplexer 40 which de-interleaves the input bit-stream into its odd (O) and even (E) interleaves. The two interleaves are then supplied to respective, identical Fibonacci encoders 41. Each of these applies a generalized Fibonacci code of length N=232 based on those described in the IEEE paper by Immink referenced earlier. This code has bases of limited span S=9 defined (in decimal notation for ease of reference) by:

$B_n 2^9 = 512$ for n=0, 1, . . . , 4

$B_n 2^9 = 496$ for n=5, 6, 7, 8

$B_n 2^9 = 495 - n + 9$ for n=9, 10, . . . , 231.

This generalized Fibonacci code has a uniform j-constraint profile of j=7. The resulting Fibonacci-encoded interleave bit-streams are then re-interleaved by multiplexer 42. Bit-inversion is then performed by inverter 43 to produce the output of the modulation encoder. Overall, therefore, the modulation encoder implements a rate 462/464 block code. Since a j=7 constraint is applied in each interleave, after the bit inversion by inverter 43 the encoder output satisfies the constraints K=14 and L=7. Hence, when this modulation encoder is used in forward concatenation schemes based on FIG. 2 or 4, the constraints at the channel input will be $C_{VFO} = c_0 = c_1 = c_a = 18$, and $i_0 = i_1 = 9$. For RC schemes, this code allows 8-bit RS parity symbol insertion without destroying the constraints, although the values of the constraints parameters are somewhat increased by this process. Various other coding schemes based on two-way interleaved Fibonacci codes may also be employed. For example, the paper "Enumerative Encoding with Non-uniform Modulation Constraints" referenced above discloses rate 225/226 and rate 199/200 Fibonacci codes for use in a two-way interleaved coding scheme with prefix encoding employed at the input prior to separation and Fibonacci encoding of the odd and even interleaves.

Three further preferred coding schemes employ the modulation encoder disclosed in our copending European Patent Application No. 07120162.8, filed on Nov. 7, 2007, the relevant content of which is incorporated herein by reference. Briefly, this encoder applies a 4-ary enumerative encoding algorithm to the input bit-stream to simultaneously encode respective generalized Fibonacci codes in the odd and even interleaves of the input bit-stream as a single enumerative code with 4-ary output symbols. The 4-ary encoder thus applies a two-way interleaved Fibonacci code as in the second coding scheme described above, but does not require separation and independent coding of the two interleaves. The 4-ary symbols of the encoding process are each represented by two bits. These bits are then interleaved for the succession of 4-ary symbols to produce a binary output stream which is subject to bit-inversion. The resulting modulation encoded bit-sequence thus satisfies K and L constraints where K=2L as in the second scheme above. Here, however, different Fibonacci codes are employed as the underlying code applied by the 4-ary encoder to both interleaves. The first of these is a generalized Fibonacci code of length N=118, having a j=7 constraint and bases with limited span S=9 defined by:

$B_n 2^9 = 512$ for n=1, 2, . . . , 5

$B_n 2^9 = 496$ for n=6, 7, 8, 9

$B_n 2^9 = 505 - n$ for n=10, 11, . . . , 118.

(Note that the range of n is specified here as n=1, 2, . . . , N for consistency with our copending application referenced above). This gives an encoder output satisfying the constraints K=14 and L=7. This code allows partial symbol interleaving of 8-bit RS parity bytes at any desired locations spaced by at least 16 bit-positions.

Figure 9:
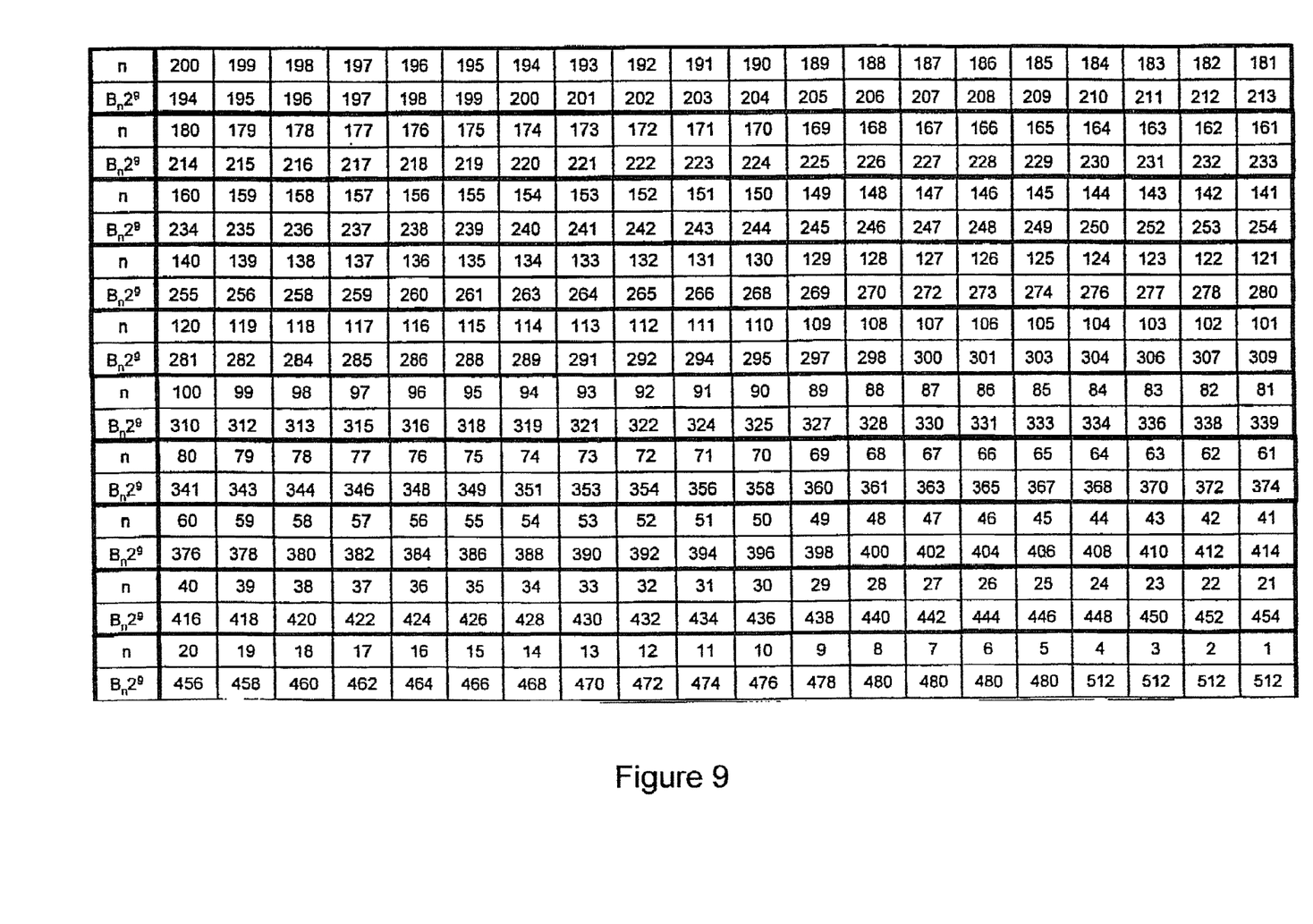
FIGS. 9 and 10 tabulate the bases of respective Fibonacci codes employed in two further modulation encoders for use in modulation coding apparatus embodying the invention.

The second code utilized by the 4-ary encoder is a generalized Fibonacci code of length N=200, having a j=6 constraint and bases with span S=9 defined by the table of FIG. 9. The j-constraint profile of this code is j(n)=6 within the codewords, i.e., for n=6, 7, . . . , 199. At the boundaries, the following j-constraints apply:

at the left boundary: j(1)=1, j(2)=2, j(3)=3, j(4)=3, j(5)=4, j(6)=5;

at the right boundary: j(200)=3.

Thus, the j=6 constraint applies within codewords and across codeword boundaries. This code gives an encoder output satisfying the constraints K=12 and L=6. This code allows partial symbol interleaving of 8-bit RS parity bytes at any locations spaced by at least 14 bit-positions.

Figure 10:
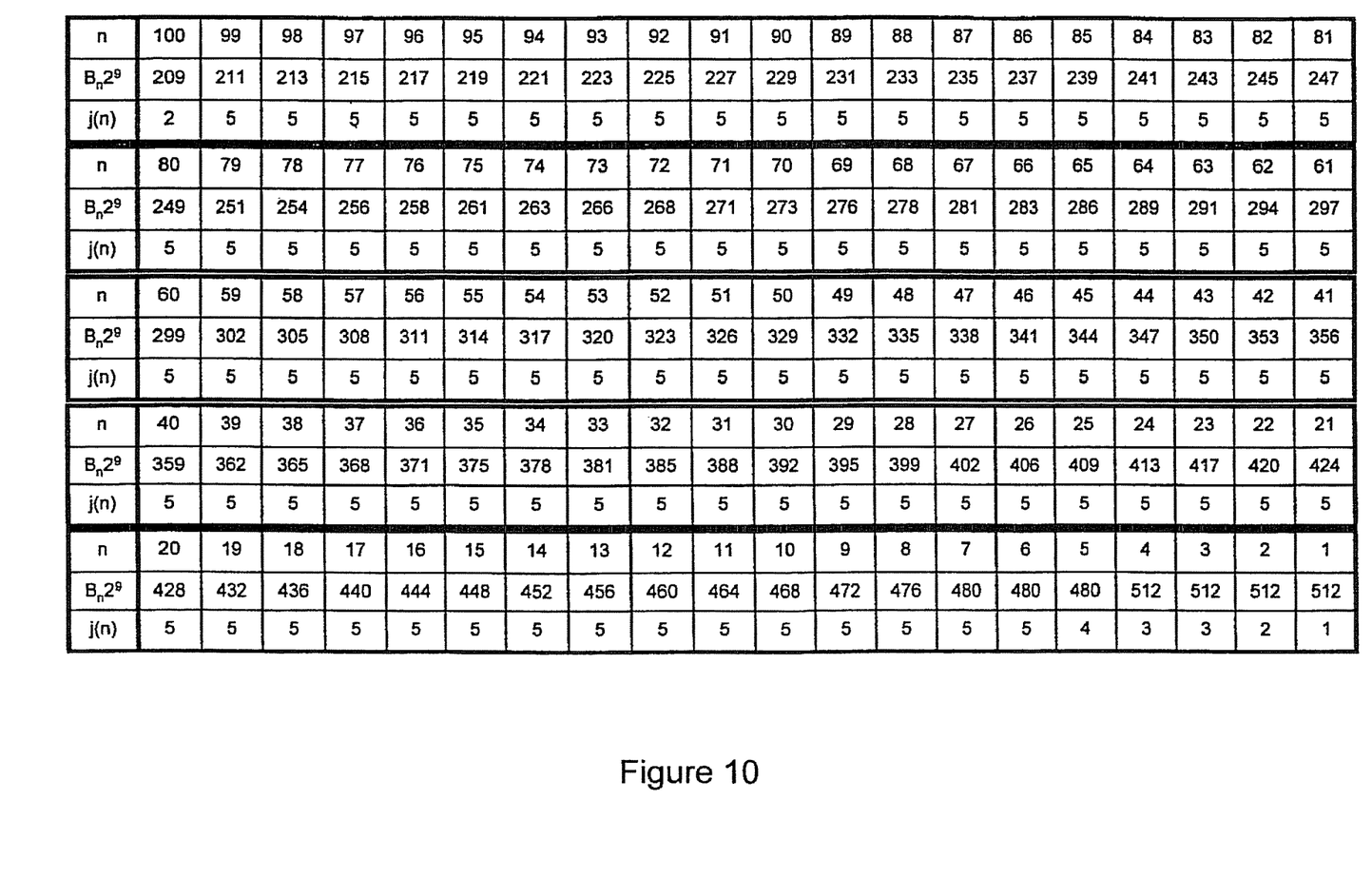

The third code utilized by the 4-ary encoder is a generalized Fibonacci code of length N=100, with a j=5 constraint and bases of span S=9 as defined in the table of FIG. 10. This code gives an encoder output satisfying the constraints K=10 and L=5. This code allows partial symbol interleaving of 8-bit RS parity bytes at any locations spaced by at least 12 bit-positions.

Figure 11:
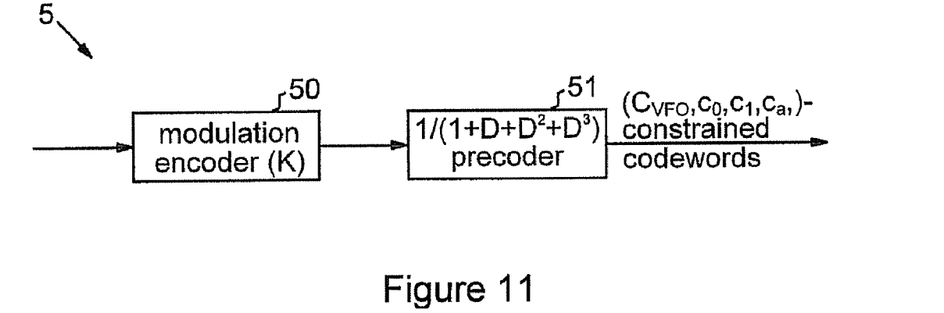
FIGS. 11 and 12 show two further embodiments of modulation coding apparatus for use in the data storage system of FIG. 1.

FIG. 11 is an example of a different form of modulation system 5. This system comprises a modulation encoder 50 and a $1/(1 \oplus D \oplus D^2 \oplus D^3)$ precoder 51. Modulation encoder 50 applies a modulation code to impose a K-constraint as defined herein, i.e. the maximum run-length of 0's in the encoded bit-sequence is constrained to K. Precoder 51 then effects $1/(1 \oplus D \oplus D^2 \oplus D^3)$ precoding of the encoded bit-sequence. The effect of this is to translate the K constraint in the input bit-sequence into a set of four constraints at the precoder output. Specifically, in the precoded bit-sequence output by precoder 51 the following constraints are satisfied:

the maximum length of the VFO pattern . . . 001100110011 . . . is constrained to $C_{VFO} = K+3$;

the maximum run-length of 0's is constrained to $c_0 = K+3$;

the maximum run-length of 1's is constrained to $c_1 = K+3$; and the maximum number of alternating bits is constrained to $c_a = K+3$.

Thus, again, the combined effect of modulation encoder 50 and precoder 51 is to impose the VFO constraint $C_{VFO}$, as well as the other constraints specified, in a simple and efficient manner. Any code which imposes the K-constraint can be employed in the modulation encoder 50, whereby efficient, high-rate codes can be selected according to requirements. Numerous such codes will be apparent to those skilled in the art. By way of example, however, a rate 32/33, K=6 code which may be employed here is described in U.S. Pat. No. 6,184,806. Exemplary high-rate encoders imposing a G-constraint, and which may therefore be employed for encoder 50, are also disclosed in U.S. Pat. No. 6,204,781.

Figure 12:
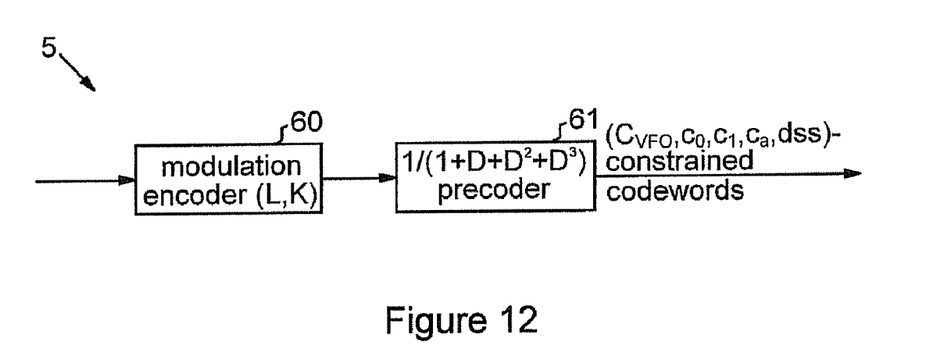

Another embodiment of modulation system 5 is illustrated in FIG. 12. Like FIG. 11, this comprises a modulation encoder 60 and a $1/(1 \oplus D \oplus D^2 \oplus D^3)$ precoder 61. In this case, however, modulation encoder 61 is a (K,L) encoder as defined herein and thus additionally constrains the run-length of 0's in the odd and even interleaves of the encoded bit-sequence to L. Here, the effect of the ensuing $1/(1 \oplus D \oplus D_2 \oplus D^3)$ precoding is to give the same four constraints listed above for FIG. 11, and additionally to translate the L-constraint at the precoder input into the data sequence separator (DSS) constraint at the precoder output. That is, the DSS pattern (defined in LTO standards as a periodic sequence of 1 followed by eleven 0's in NRZI notation) is excluded in the precoded bit sequence. Again, any (K,L) encoder may be employed as modulation encoder 60, and preferred examples have already been described with reference to FIGS. 2 to 9.

In FIGS. 11 and 12, the precoded sequence output by precoder 51, 61 may be supplied directly to channel 2 for recording, or ECC coding may be performed prior to recording in RC schemes. On reproduction, the inverse precoding performed in modulation decoder 7 will of course be $(1 \oplus D \oplus D^2 \oplus D^3)$ inverse precoding in this case. Note that, while precoder 51, 61 effects the $1/(1 \oplus D \oplus D^2 \oplus D^3)$ precoding in a single precoding stage in the examples illustrated, the precoding could be performed over a plurality of stages, e.g. $1/(1 \oplus D^2)$ followed by a separate stage of $1/(1 \oplus D)$ precoding, if desired.

It will be appreciated that many changes and modifications can be made to the specific embodiments described above. For example, while application in a tape drive has been described as an example, embodiments of the invention can of course be employed in other data storage devices, for instance optical storage systems. Many other changes and modifications can be made to the embodiments described without departing from the scope of the invention.

The invention claimed is:

1. An apparatus for modulation coding of input data, the apparatus comprising:
    a modulation encoder for applying a modulation code to the input data to produce an encoded bit-sequence in which the maximum run-length of 0's is constrained to a predetermined value K and the maximum run-length of 0's in each of the odd and even interleaves of the encoded bit-sequence is constrained to a predetermined value L; and
    a precoder for effecting $1/(1 \oplus D^4)$ precoding of the encoded bit-sequence to produce a precoded sequence in which the maximum length of the variable frequency oscillator pattern is constrained to a predetermined value $C_{VFO}$.

2. The apparatus of claim 1, wherein the precoder comprises a single precoder stage for effecting the $1/(1 \oplus D^4)$ precoding.

3. The apparatus of claim 1, wherein the precoder comprises a plurality of precoder stages (which together effect the $1/(1 \oplus D^4)$ precoding.

4. The apparatus of claim 1, wherein $C_{VFO}=K+4$.

5. The apparatus of claim 1, wherein the precoder produces a precoded sequence in which at least one of the constraints is satisfied:
    (a) the maximum run-length of 0's is constrained to a predetermined value $c_0$;
    (b) the maximum run-length of 1's is constrained to a predetermined value $c_1$;
    (c) the maximum number of alternating bits is constrained to a predetermined value $c_a$;
    (d) the maximum run-length of 0's in each of the odd and even interleaves is constrained to a predetermined value $i_0$; and
    (e) the maximum run-length of 1's in each of the odd and even interleaves is constrained to a predetermined value $i_1$;
    is satisfied.

6. The apparatus of claim 4, wherein all of the constraints (a) to (e) are satisfied in the precoded sequence.

7. The apparatus of claim 4, wherein the values of $c_0$, $c_1$, and $c_a$ are equal to K+4 and the values of $i_0$ and $i_1$ are equal to L+2.

8. The apparatus of claim 3, wherein the precoder comprises a first precoder stage for effecting $1/(1 \oplus D \oplus D^2 \oplus D^3)$ precoding of the encoded bit-sequence to produce a partially-precoded bit sequence, and a second precoder stage for effecting $1/(1 \oplus D)$ precoding of the partially-precoded bit sequence to produce said precoded sequence.

9. The apparatus of claim 8, further comprising an ECC encoder for effecting error-correction coding of the partially-precoded bit sequence prior to said $1/(1 \oplus D)$ precoding.

10. The apparatus of claim 9, wherein the ECC encoder is adapted to effect partial interleaving of parity symbols in the partially-precoded bit sequence.

11. An apparatus for modulation coding of input data, the apparatus comprising:
    a modulation encoder for applying a modulation code to the input data to produce an encoded bit-sequence in which the maximum run-length of 0's is constrained to a predetermined value K; and
    a precoder for effecting $1/(1 \oplus D \oplus D^2 \oplus D^3)$ precoding of the encoded bit-sequence to produce a precoded sequence in which the maximum length of the variable frequency oscillator pattern is constrained to a predetermined value $C_{VFO}$.

12. The apparatus of claim 11, wherein the precoder comprises a single precoder stage for effecting the $1/(1 \oplus D \oplus D^2 \oplus D^3)$ precoding.

13. The apparatus of claim 11, wherein the precoder comprises a plurality of precoder stages which together effect the $1/(1 \oplus D \oplus D^2 \oplus D^3)$ precoding.

14. The apparatus of claim 11, wherein the modulation encoder is adapted to apply a modulation code such that the maximum run-length of 0's in each of the odd and even interleaves of the encoded bit-sequence is constrained to a predetermined value L, the arrangement being such that the precoder produces a precoded sequence in which the data sequence separator pattern is excluded.

15. The apparatus of claim 11, wherein $C_{VFO}=K+3$.

16. The apparatus of claim 11, wherein the precoder produces a precoded sequence in which at least one of the following constraints is satisfied:
    (a) the maximum run-length of 0's is constrained to a predetermined value $c_0$;
    (b) the maximum run-length of 1's is constrained to a predetermined value $c_1$; and
    (c) the maximum number of alternating bits is constrained to a predetermined value $c_a$.

17. The apparatus of claim 16, wherein all of the constraints (a) to (c) are satisfied in the precoded sequence.

18. The apparatus of claim 17, wherein the values of $c_0$, $c_1$, and $c_a$ are equal to K+3.

19. The apparatus of claim 14, wherein the modulation encoder is adapted to apply a rate X/Y partitioned block code to produce the encoded bit-sequence by:
    partitioning each of a succession of X-bit input data words into a plurality of blocks of bits; and
    for each X-bit data word, encoding at least one of said blocks in accordance with a finite state coding scheme, thereby to produce a Y-bit codeword from the X-bit data word.

20. The apparatus of claim 14, wherein the modulation encoder is adapted to apply an enumerative modulation code to the input data.

21. The apparatus of claim 20, wherein the modulation encoder is adapted to apply a generalized Fibonacci code in each of odd and even interleaves of the input data to produce the encoded bit-sequence.

22. A method for modulation coding of input data, the method comprising:
    applying a modulation code to the input data to produce an encoded bit-sequence in which the maximum run-length of 0's is constrained to a predetermined value K and the maximum run-length of 0's in each of the odd and even interleaves of the encoded bit-sequence is constrained to a predetermined value L; and effecting $1/(1\oplus D^4)$ precoding of the encoded bit-sequence to produce a precoded sequence in which the maximum length of the variable frequency oscillator pattern is constrained to a predetermined value $C_{VFO}$.

23. The method of claim 22, wherein $C_{VFO}=K+4$.

24. The method of claim 22, wherein the precoding is effected such that in the precoded sequence:
   (a) the maximum run-length of 0's is constrained to a predetermined value $c_0$;
   (b) the maximum run-length of 1's is constrained to a predetermined value $c_1$;
   (c) the maximum number of alternating bits is constrained to a predetermined value $c_a$;
   (d) the maximum run-length of 0's in each of the odd and even interleaves is constrained to a predetermined value $i_0$; and
   (e) the maximum run-length of 1's in each of the odd and even interleaves is constrained to a predetermined value $i_1$.

25. The method of claim 24, wherein the precoding is effected such that the values of $c_0$, $c_1$, and $c_a$ are equal to K+4 and the values of $i_0$ and $i_1$ are equal to L+2.

* * * * *